(12) United States Patent
Nakamura et al.

(10) Patent No.: US 11,164,845 B2
(45) Date of Patent: Nov. 2, 2021

(54) RESIST STRUCTURE FOR FORMING BUMPS

(71) Applicant: INTERNATIONAL BUSINESS MACHINES CORPORATION, Armonk, NY (US)

(72) Inventors: Eiji Nakamura, Kanagawa (JP); Toyohiro Aoki, Kanagawa (JP); Takashi Hisada, Tokyo (JP); Risa Miyazawa, Kanagawa (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/777,416

(22) Filed: Jan. 30, 2020

(65) Prior Publication Data
US 2021/0242164 A1 Aug. 5, 2021

(51) Int. Cl.
*H01L 23/00* (2006.01)
*H01L 25/00* (2006.01)

(52) U.S. Cl.
CPC ............. *H01L 24/81* (2013.01); *H01L 24/11* (2013.01); *H01L 24/13* (2013.01); *H01L 24/32* (2013.01); *H01L 24/83* (2013.01); *H01L 25/50* (2013.01); *H01L 2224/13* (2013.01); *H01L 2924/14* (2013.01)

(58) Field of Classification Search
CPC ......... H01L 24/81; H01L 24/11; H01L 24/13; H01L 24/32; H01L 24/83; H01L 25/50; H01L 2224/13; H01L 2924/14
See application file for complete search history.

(56) References Cited

U.S. PATENT DOCUMENTS

| | | | |
|---|---|---|---|
| 8,536,047 B2 | 9/2013 | Zhang et al. | |
| 9,258,904 B2 | 2/2016 | Pendse | |
| 2006/0088992 A1* | 4/2006 | Huang | H01L 24/05 438/614 |
| 2006/0094226 A1* | 5/2006 | Huang | H01L 24/11 438/613 |
| 2011/0147061 A1* | 6/2011 | Leung | H01L 23/49822 174/260 |
| 2013/0049190 A1* | 2/2013 | Topacio | H01L 24/13 257/737 |
| 2015/0140801 A1* | 5/2015 | Toh | H01L 21/6835 438/613 |
| 2015/0194379 A1* | 7/2015 | Chen | H01L 23/49822 257/668 |

(Continued)

*Primary Examiner* — Douglas W Owens
(74) *Attorney, Agent, or Firm* — Tutunjian & Bitetto, P.C.; Randall Bluestone

(57) ABSTRACT

A method for fabricating a resist structure is presented. The method includes preparing a substrate on which plural conductive pads are formed; and patterning a lower resist to form plural lower cavities. The lower resist is deposited above the substrate. Each of the plural lower cavities are located above a corresponding one of the plural conductive pads. Additionally, the method includes patterning an upper resist to form plural upper cavities. The upper resist is deposited on the lower resist. Each of the plural upper cavities are located on a corresponding one of the plural lower cavities and have a diameter larger than a diameter of the corresponding one of the plural lower cavities.

24 Claims, 17 Drawing Sheets

(56) References Cited

U.S. PATENT DOCUMENTS

| | | | |
|---|---|---|---|
| 2015/0228595 A1* | 8/2015 | Willeke | H01L 24/03 |
| | | | 438/614 |
| 2015/0294948 A1* | 10/2015 | Ayotte | H01L 24/81 |
| | | | 257/737 |
| 2016/0313644 A1* | 10/2016 | Oori | G03F 7/0757 |
| 2018/0277509 A1 | 9/2018 | Aoki et al. | |
| 2019/0043821 A1 | 2/2019 | Pun et al. | |
| 2020/0075496 A1* | 3/2020 | Yu | H01L 24/32 |
| 2020/0083178 A1* | 3/2020 | Street | H01L 25/0657 |

* cited by examiner

RESIST STRUCTURE FOR FORMING BUMPS

BACKGROUND

The present invention generally relates to bumping technology and, more particularly, to a resist structure for forming bumps and a fabricating method thereof.

The bumps are connection parts used when, for example, a semiconductor chip is connected to a circuit board by flip-chip bonding. For example, when the semiconductor chip is miniaturized, it is required to easily form fine bumps.

SUMMARY

According to an embodiment of the present invention, there is provided a method for fabricating a resist structure. The method includes preparing a substrate on which plural conductive pads are formed. The method further includes patterning a lower resist to form plural lower cavities, the lower resist being deposited above the substrate, each of the plural lower cavities being located above corresponding one of the plural conductive pads. The method further includes patterning an upper resist to form plural upper cavities, the upper resist being deposited on the lower resist, each of the plural upper cavities being located on corresponding one of the plural lower cavities and having a diameter larger than a diameter of the corresponding one of the plural lower cavities.

According to another embodiment of the present invention, there is provided a method for fabricating a semiconductor device. The method includes preparing a substrate on which plural conductive pads are formed. The method further includes patterning a lower resist to form plural lower cavities, the lower resist being deposited above the substrate, each of the plural lower cavities being located above corresponding one of the plural conductive pads. The method further includes patterning an upper resist to form plural upper cavities, the upper resist being deposited on the lower resist, each of the plural upper cavities being located on corresponding one of the plural lower cavities and having a diameter larger than a diameter of the corresponding one of the plural lower cavities. The method further includes forming plural conductive pillars, each of the plural conductive pillars being located in corresponding one of the plural lower cavities. The method further includes filling conductive material in the plural upper cavities to form plural bumps, each of the plural bumps being located on corresponding one of the plural conductive pillars. The method further includes connecting the plural bumps to a circuit board by flip-chip bonding.

According to still another embodiment of the present invention, there is provided a resist structure. The resist structure includes a substrate on which plural conductive pads are formed. The resist structure further includes a lower resist in which plural lower cavities are formed, the lower resist being deposited above the substrate, each of the plural lower cavities being located above corresponding one of the plural conductive pads. The resist structure further includes an upper resist in which plural upper cavities are formed, the upper resist being deposited on the lower resist, each of the plural upper cavities being located on corresponding one of the plural lower cavities and having a diameter larger than a diameter of the corresponding one of the plural lower cavities.

According to still another embodiment of the present invention, there is provided a semiconductor device. The semiconductor device includes a substrate on which plural conductive pads are formed. The semiconductor device further includes a lower resist in which plural lower cavities are formed, the lower resist being deposited on the substrate, each of the plural lower cavities being located on corresponding one of the plural conductive pads. The semiconductor device further includes an upper resist in which plural upper cavities are formed, the upper resist being deposited on the lower resist, each of the plural upper cavities being located on corresponding one of the plural lower cavities and having a diameter larger than a diameter of the corresponding one of the plural lower cavities. The semiconductor device further includes plural conductive pillars, each of the plural conductive pillars being located in corresponding one of the plural lower cavities. The semiconductor device further includes plural bumps formed by filling conductive material in the plural upper cavities, each of the plural bumps being located on corresponding one of the plural conductive pillars. The semiconductor device further includes a circuit board to which the plural bumps are connected by flip-chip bonding.

According to still another embodiment of the present invention, there is provided an electronic apparatus including the aforementioned semiconductor device and a signal processor configured to process a signal outputted from the semiconductor device.

DETAILED DESCRIPTION

Hereinafter, exemplary embodiments of the present invention will be described in detail with reference to the attached drawings.

It is to be noted that the present invention is not limited to these exemplary embodiments to be given below and can be implemented with various modifications within the scope of the present invention. In addition, the drawings used herein are for purposes of illustration, and may not show actual dimensions.

First, an explanation will be given of the first exemplary embodiment in which the present invention is applied to a case where bumps are formed by Injection Molded Solder (IMS) technology.

In IMS technology, the molten solder is injected into cavities formed in a resist on a semiconductor chip by an IMS head scanning over the resist. Injection of the molten solder into smaller-diameter cavities requires a higher injection pressure, which requires a higher IMS head pressure.

However, the higher IMS head pressure could have several negative effects on the bumps. For example, the negative effects include deformation of the resist and larger friction between the resist and a surface of the IMS head. Also, the higher IMS head pressure (and high temperature due to the large friction) could cause deformation of a rubber of the IMS head, and such deformation could cause solder leakage more frequently.

Therefore, there is a substantial limitation of the IMS head pressure, and the injection pressure is limited by the limitation of the IMS head pressure.

Figure 1:
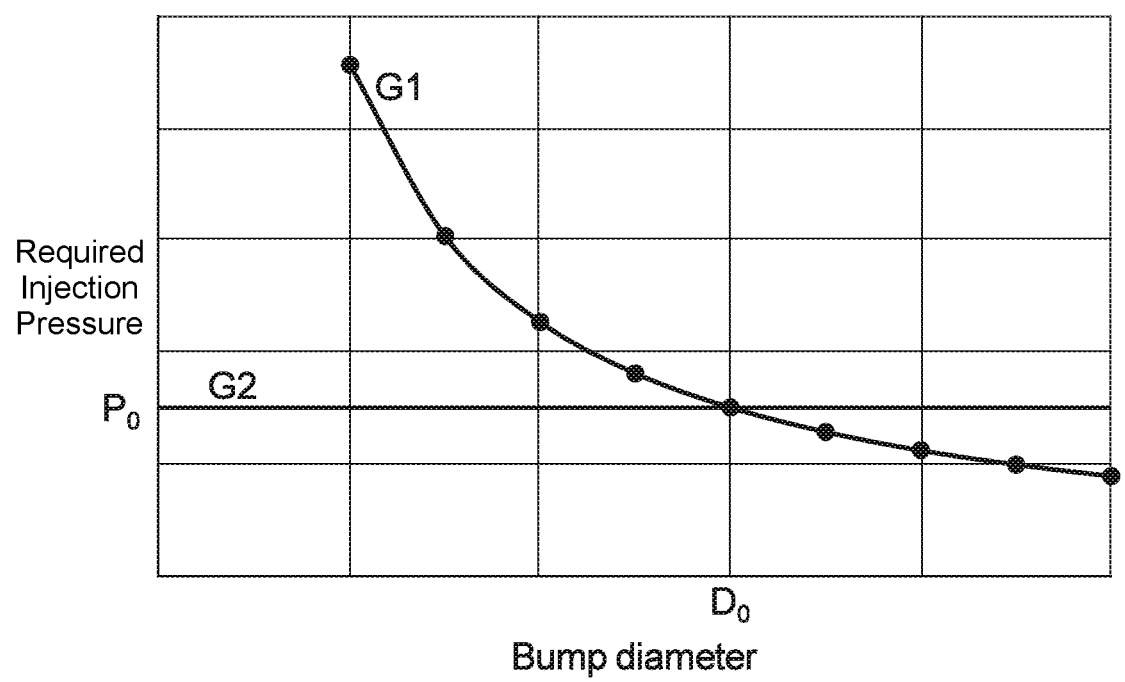
FIG. 1 depicts a first graph representing a relationship between a bump diameter and a required injection pressure for the bump diameter, and a second graph representing an injection pressure limit due to a limitation of an IMS head pressure.

Referring to FIG. 1, there are shown a first graph G1 representing a relationship between a bump diameter and a required injection pressure for the bump diameter, and a second graph G2 representing an injection pressure limit P0 due to the limitation of the IMS head pressure. The graph G1 is obtained using a model.

Figure 2:
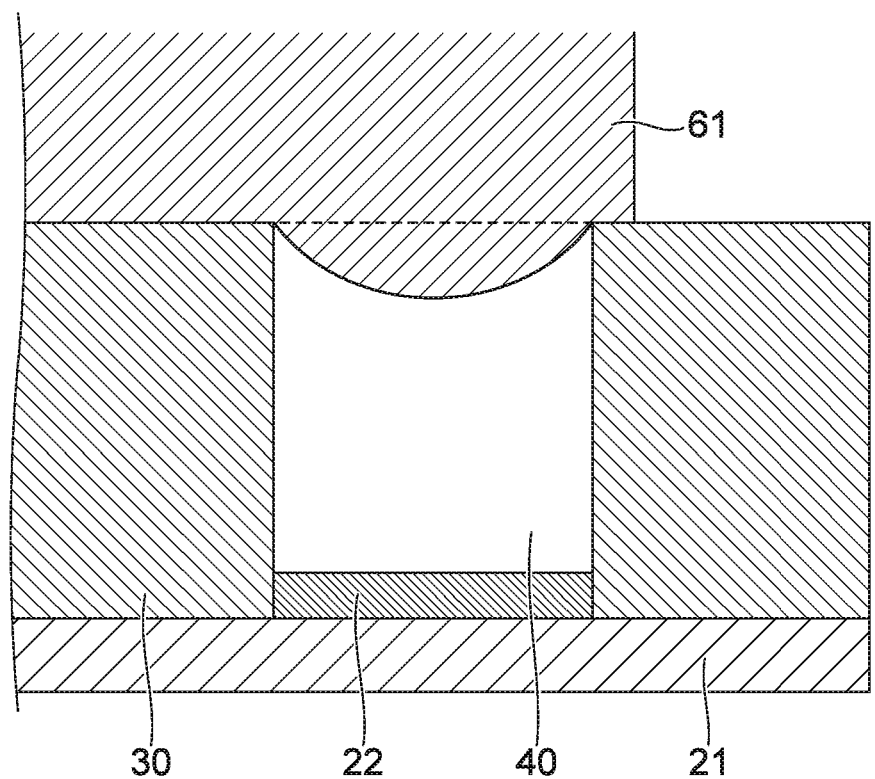
FIG. 2 depicts a cross-sectional view used to explain a process for obtaining a graph G1 using a model.
Figure 3:
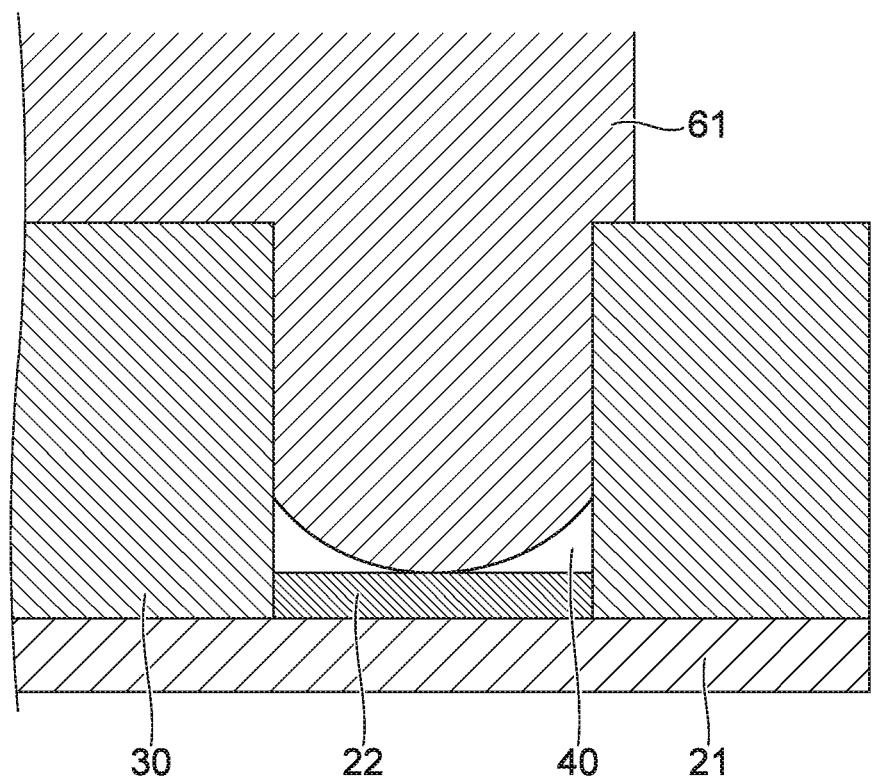
FIG. 3 depicts a cross-sectional view used to explain the process for obtaining the graph G1 using the model.

Referring to FIGS. 2 and 3, there are shown cross-section diagrams used to explain a process for obtaining the graph G1 using the model. In the model shown in FIGS. 2 and 3, a resist 30 is deposited on a substrate 21, a cavity 40 is formed in the resist 30, an under bump metal (UBM) 22 is deposited on the substrate 21 within the cavity 40, and molten solder 61 is being injected into the cavity 40.

FIG. 2 shows an initial state of the model, which is a state of the model at the moment when the molten solder 61 caps an opening of the cavity 40.

On the other hand, FIG. 3 shows a state of the model at the moment when the molten solder 61 contacts the UBM 22.

The graph G1 is obtained by using the property that a smaller diameter of the cavity 40 leads to greater influence of surface tension between the molten solder 61 and remaining gas in the cavity 40 and thus leads to the increased required injection pressure.

Returning to FIG. 1, it can be seen from the graph G1 that the required injection pressure increases as the bump diameter decreases. Also, from the graph G2, which is the above second graph, it can be seen that the injection pressure limit is P0. Further, from the graphs G1 and G2, it can be seen that the required injection pressure exceeds the injection pressure limit P0 when the bump diameter is smaller than D0. In view of this, the first exemplary embodiment provides a resist structure which reduces the required injection pressure for finer-pitch bumps made of molten solder injected using IMS technology.

Next, a concept of the first exemplary embodiment will be described.

Figure 4A:
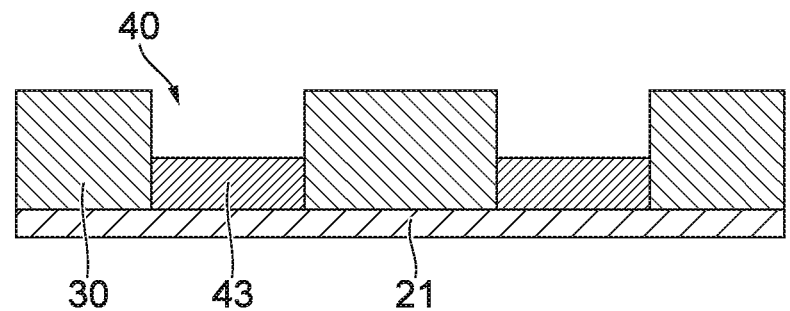
FIG. 4A depicts a cross-sectional view of a commonly used process.
Figure 4B:
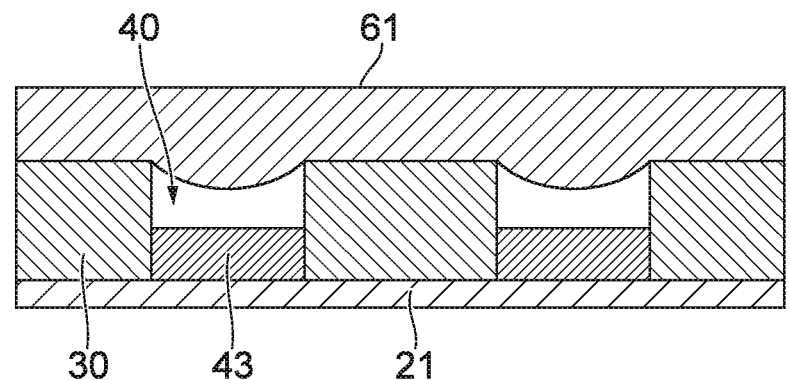
FIG. 4B depicts a cross-sectional view of a commonly used process.
Figure 4C:
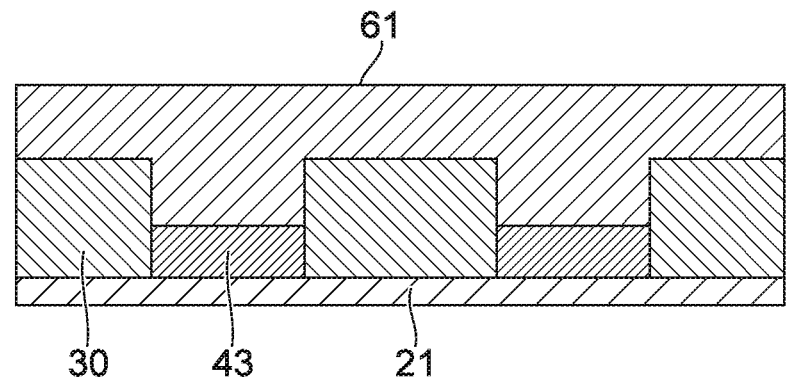
FIG. 4C depicts a cross-sectional view of a commonly used process.
Figure 4D:
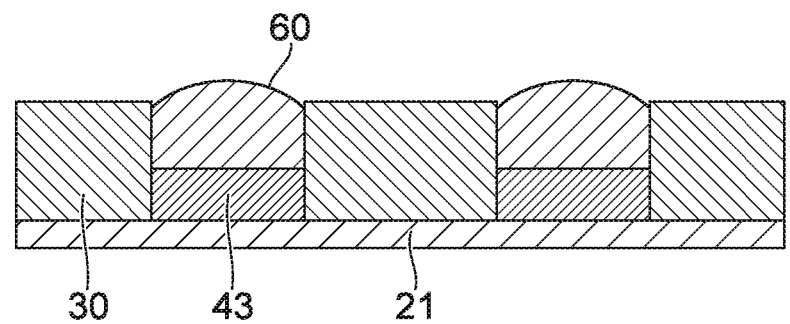
FIG. 4D depicts a cross-sectional view of a commonly used process.
Figure 5:
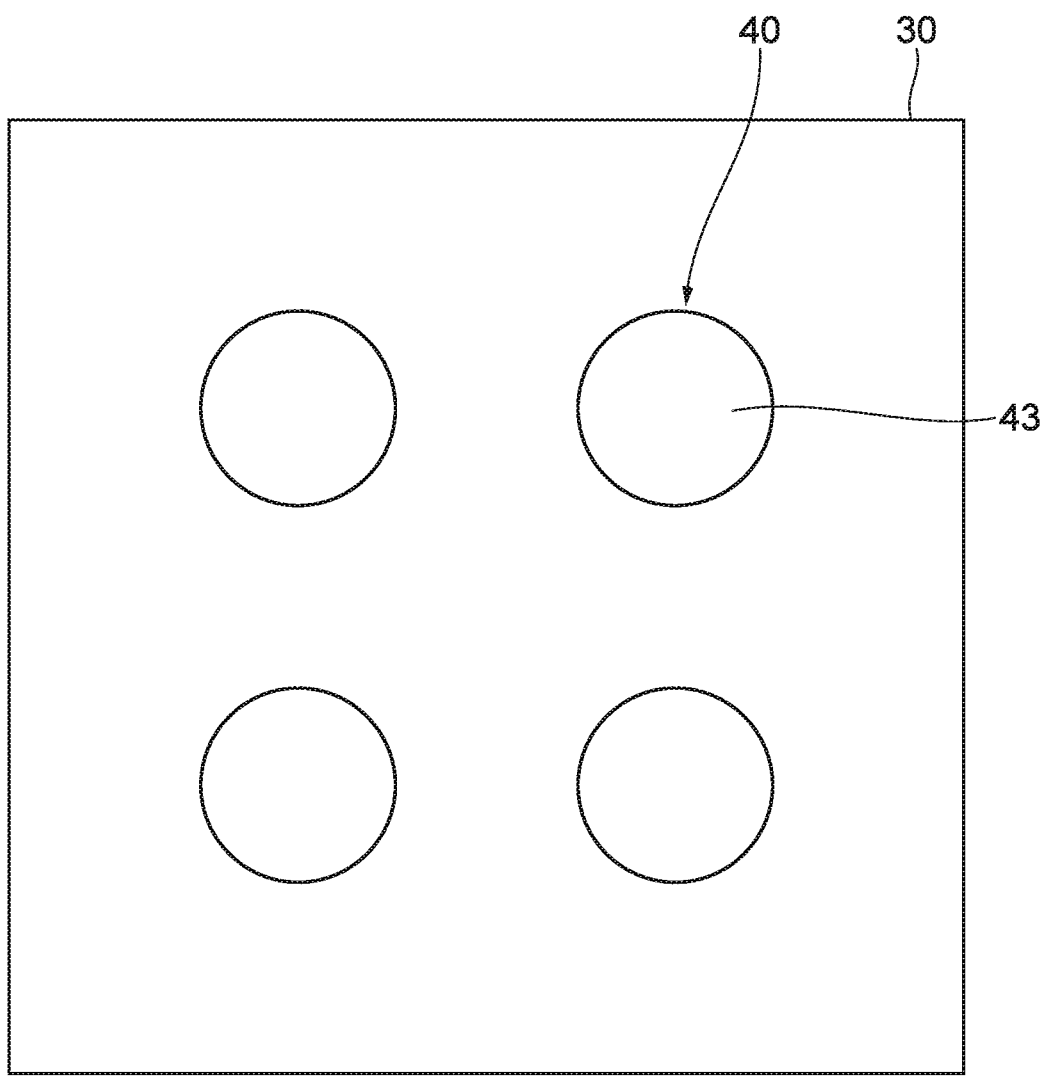
FIG. 5 depicts a top view of the commonly used process.

Referring to FIGS. 4A to 4D and FIG. 5, there are shown cross-sectional views and a top view, respectively, of a commonly used process. In FIG. 4A, cavities 40 are formed by exposure and development in a resist 30 on a substrate 21. And then, copper pillars 43 are formed in the cavities 40 by plating. The top view at this time is shown in FIG. 5. FIG. 4A is a cross-sectional view of the top view of FIG. 5 cut on a cutting plane passing through the copper pillars 43 in the left-right direction. In FIG. 4B, the IMS head scans over the resist 30 to cap the cavities 40 with molten solder 61. In FIG. 4C, the molten solder 61 reaches the copper pillars 43. In FIG. 4D, the IMS head moves away and thus bumps 60 are formed.

In this process, the required injection pressure for forming the bumps 60 can exceed the injection pressure limit in a case where the fine bumps 60 are formed.

Figure 6A:
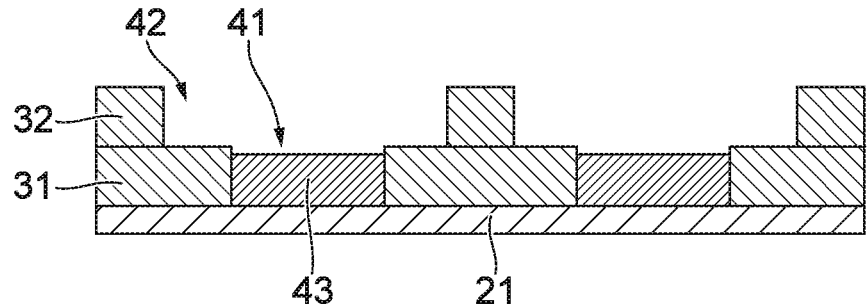
FIG. 6A depicts a cross-sectional view of a process according to a first exemplary embodiment.
Figure 6B:
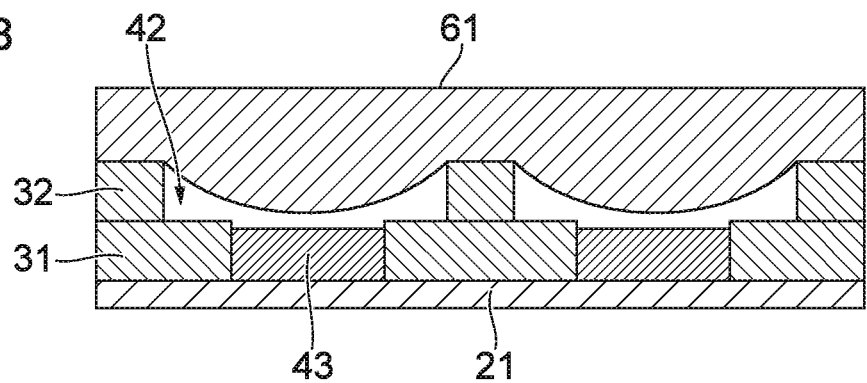
FIG. 6B depicts a cross-sectional view of a process according to a first exemplary embodiment.
Figure 6C:
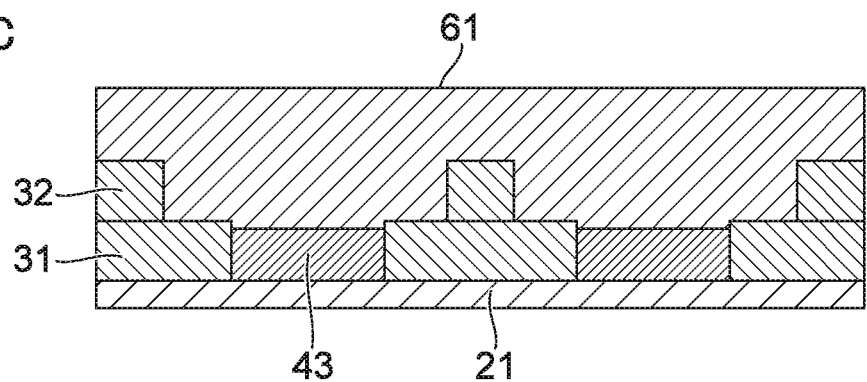
FIG. 6C depicts a cross-sectional view of a process according to a first exemplary embodiment.
Figure 6D:
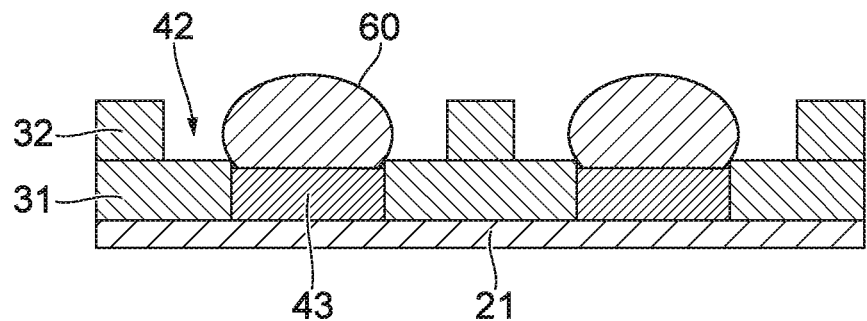
FIG. 6D depicts a cross-sectional view of a process according to a first exemplary embodiment.
Figure 7:
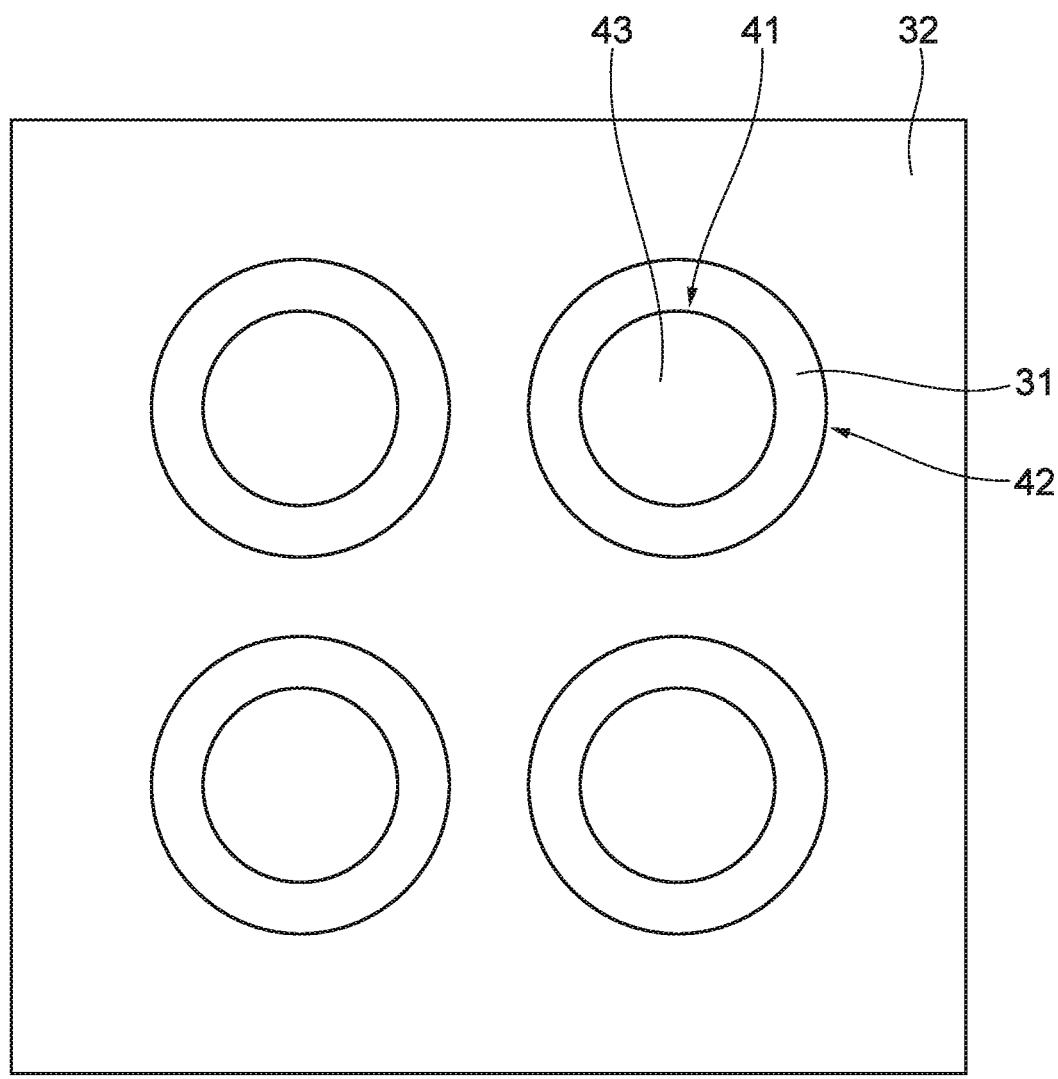
FIG. 7 depicts a top view of a design of cavities according to the first exemplary embodiment.

Referring to FIGS. 6A to 6D and FIG. 7, there are shown cross-sectional views and a top view, respectively, of the process according to the first exemplary embodiment. In FIG. 6A, lower cavities 41 can be formed by exposure and development in a lower resist 31 on a substrate 21, and upper cavities 42 can be formed by exposure and development in an upper resist 32 on the lower resist 31. The diameter of each of the upper cavities 42 can be larger than the diameter of each of the lower cavities 41. And then, copper pillars 43 can be formed in the lower cavities 41 by plating. The top view at this time is shown in FIG. 7. FIG. 6A is a cross-sectional view of the top view of FIG. 7 cut on a cutting plane passing through the copper pillars 43 in the left-right direction. In FIG. 6B, the IMS head can scan over the upper resist 32 to cap the upper cavities 42 with molten solder 61. In FIG. 6C, the molten solder 61 can reach the copper pillars 43. In FIG. 6D, the IMS head can move away and thus bumps 60 can be formed.

In this process, the required injection pressure for forming the bumps 60 can be reduced as compared with the commonly used process, and can fall below the injection pressure limit.

Next, a modification of a design of the upper cavities 42 will be described.

Any design can be used as the design of the upper cavities 42 as long as the opening area of each of the upper cavities 42 is larger than the opening area of each of the lower cavities 41 and one bump 60 is generated in each of the upper cavities 42 after the IMS head moves away. In this case, if the opening area of each of the upper cavities 42 is larger than a predetermined area, parts having a small width are generated in the upper resist 32. Thus, concerns arise regarding mechanical stability when the IMS head scans over the upper resist 32.

Figure 8:
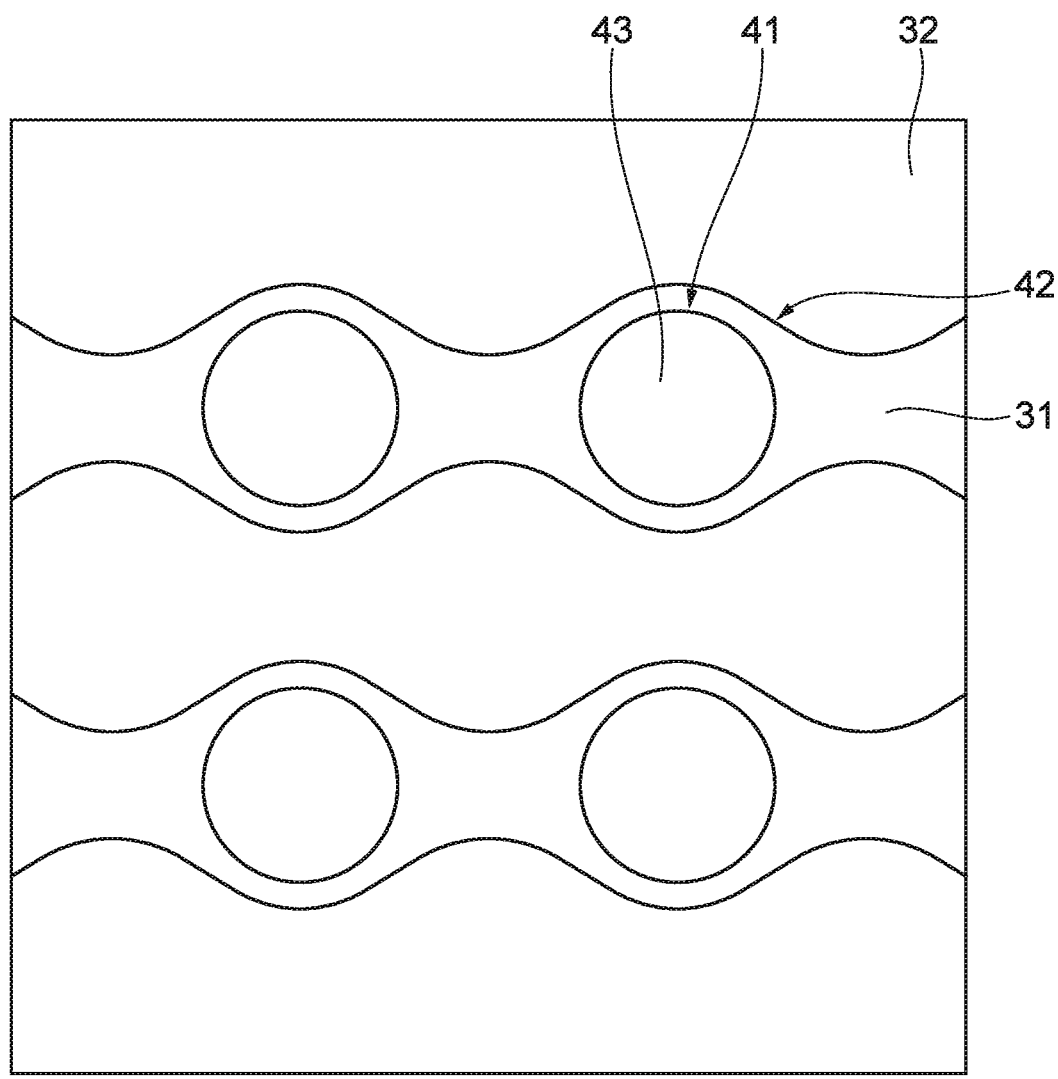
FIG. 8 depicts a top view of a modification of the design of cavities.

Referring to FIG. 8, there is shown a top view of the modification of the design for dispelling the concerns. For example, as shown in FIG. 8, the shape of an opening of each of the upper cavities 42 can be elliptical, and the upper cavities 42 aligned in one direction can be connected to each other.

In some cases, the length of the IMS head is shorter than the length of a semiconductor chip in a scanning direction. In such cases, molten solder can leak through connecting parts of the upper cavities 42, if the IMS head scans in a direction parallel to the connecting direction, namely in the left-right direction of FIG. 8. On the other hand, in some cases, the length of the IMS head is longer than the length of the semiconductor chip in a direction perpendicular to the scanning direction. In such cases, molten solder does not leak through the connecting parts if the IMS head scans in a direction perpendicular to the connecting direction, namely in the up-and-down direction of FIG. 8.

For this reason, it is desirable that the connecting direction is perpendicular to the scanning direction.

Note that although in FIG. 8 more than two upper cavities 42 appear to be connected in the left-right direction, a configuration in which at least two upper cavities 42 are connected can be employed.

In an embodiment, assuming that the required injection pressure can be sufficiently reduced even if each of the upper cavities 42 is not so large as to be connected to another upper cavity 42, each of the upper cavities 42 may not be necessarily connected to another upper cavity 42 as shown in FIG. 7.

As stated above, it is required that one bump 60 is generated in each of the upper cavities 42 after the IMS head moves away even if each of the upper cavities 42 is connected to another upper cavity 42.

Hereinafter, a simulation result indicating that one bump 60 is generated in each of the upper cavities 42 in such a situation will be described.

Referring to FIGS. 9A and 9B, and FIGS. 10A to 10D, there are shown schematic diagrams illustrating the simulation result.

Figure 9A:
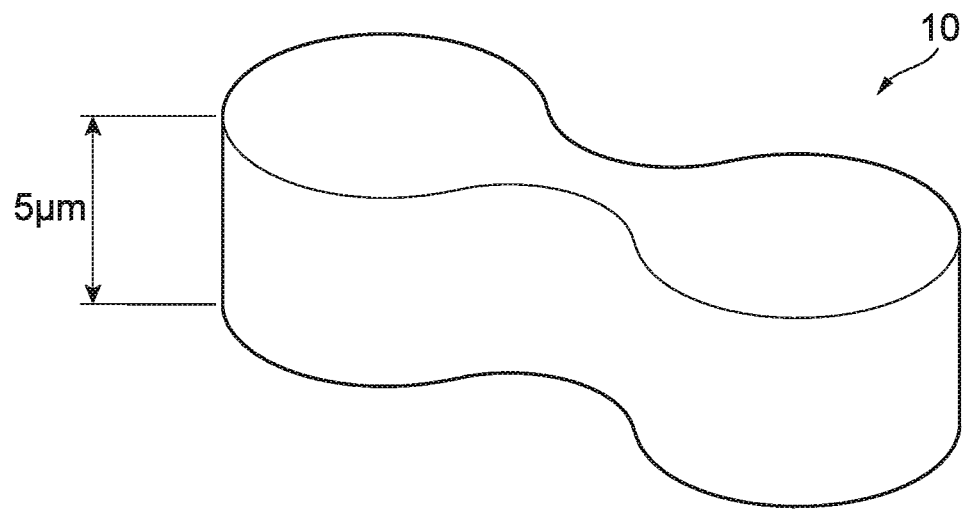
FIG. 9A is a perspective view of a space in which bumps can be formed.

FIG. 9A shows a perspective view of a space 10 in which the bumps 60, as shown, for example, in FIG. 6D can be formed. As shown in FIG. 9A, the height of the space 10 is assumed to be 5 micro meters in this simulation. This height is obtained by adding a margin for each of the bumps 60 to the thickness of the upper cavity 42, namely the thickness of the upper resist 32 which is assumed to be 1.4 micro meters.

Figure 9B:
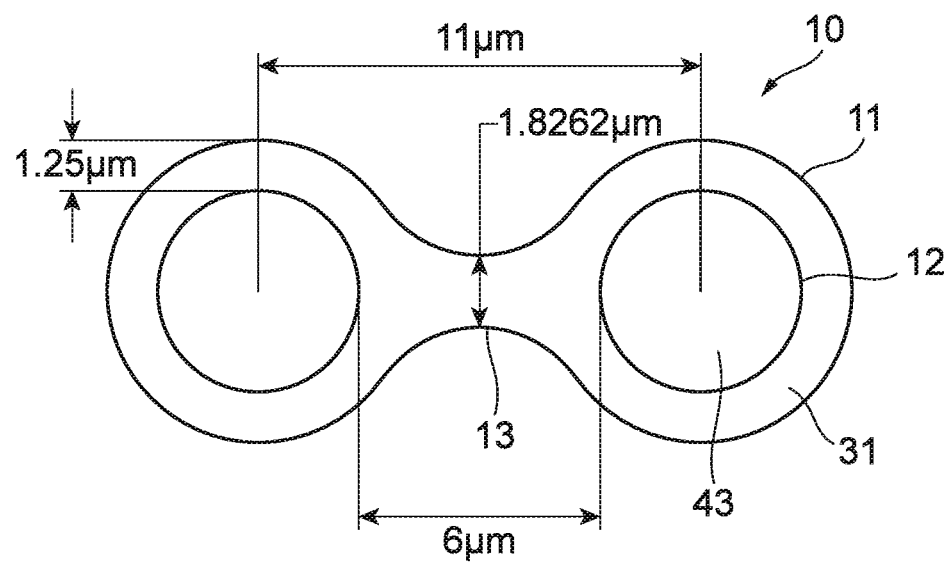
FIG. 9B is a top view of a space in which bumps can be formed.

FIG. 9B shows a top view of the space 10 in which the bumps 60 can be formed. Since the space 10 is transparent, the top view shows the bottom of the space 10. That is, in FIG. 9B, two outer circles 11 connected via a connecting part 13 indicate a lower resist 31, and two inner circles 12 not connected to each other indicate two copper pillars 43 formed in two lower cavities 41 in the lower resist 31 as shown, for example, in FIG. 8. As shown in FIG. 9B, the distance between the centers of the copper pillars 43 is assumed to be 11 micro meters, the shortest distance between the copper pillars 43 is assumed to be 6 micro meters, the width of the lower resist 31 forming a circle outside the copper pillars 43 is assumed to be 1.25 micro meters, and the width of the connecting part 13 is assumed to be 1.8262 micro meters.

Figure 10B:
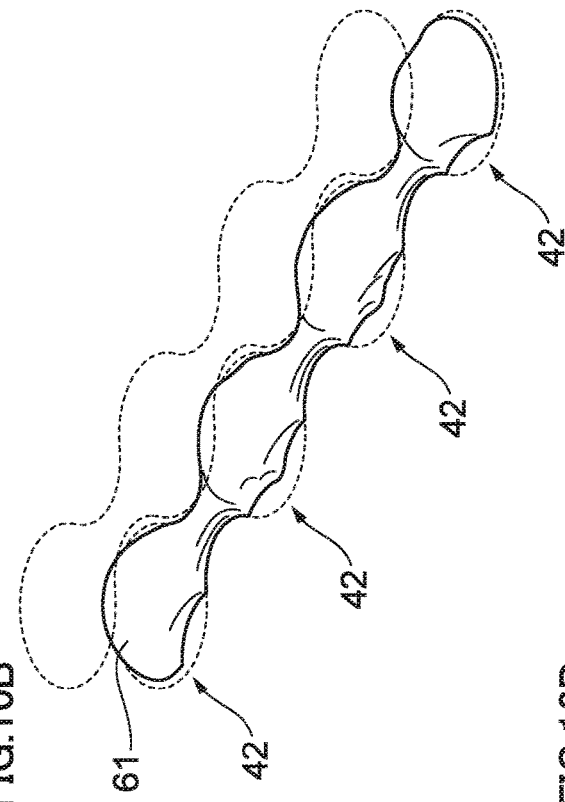
FIG. 10B depicts a perspective view illustrating a change in the shape of the molten solder after the IMS head moves away.
Figure 10D:
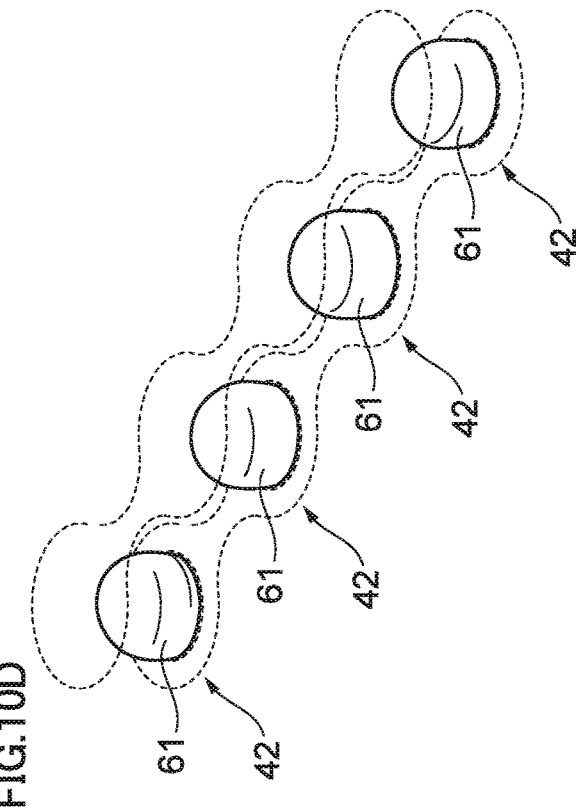
FIG. 10D depicts a perspective view illustrating a change in the shape of the molten solder after the IMS head moves away.
Figure 10A:
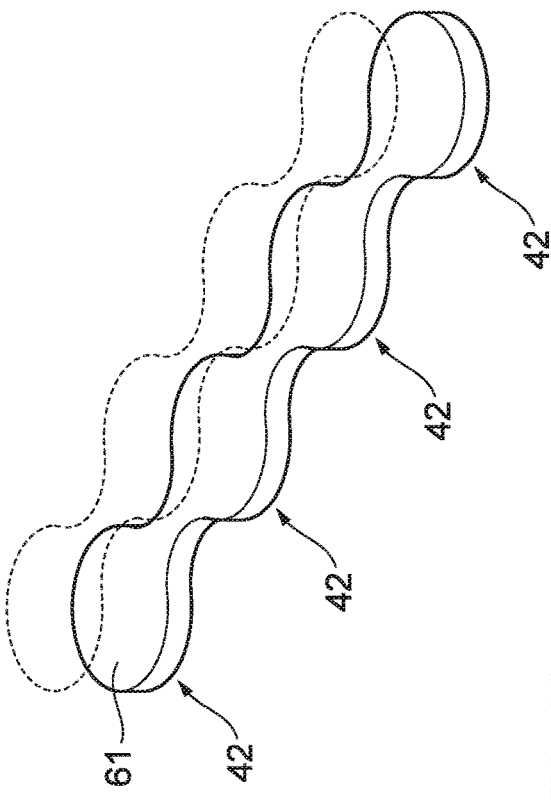
FIG. 10A depicts a perspective view immediately after the IMS head caps the upper cavities and injects molten solder into the upper cavities.

FIG. 10A shows a perspective view immediately after the IMS head caps the upper cavities 42 and injects the molten solder 61 into the upper cavities 42. In FIG. 10A, the molten solder 61 is connected according to the shape of the upper cavities 42.

Figure 10C:
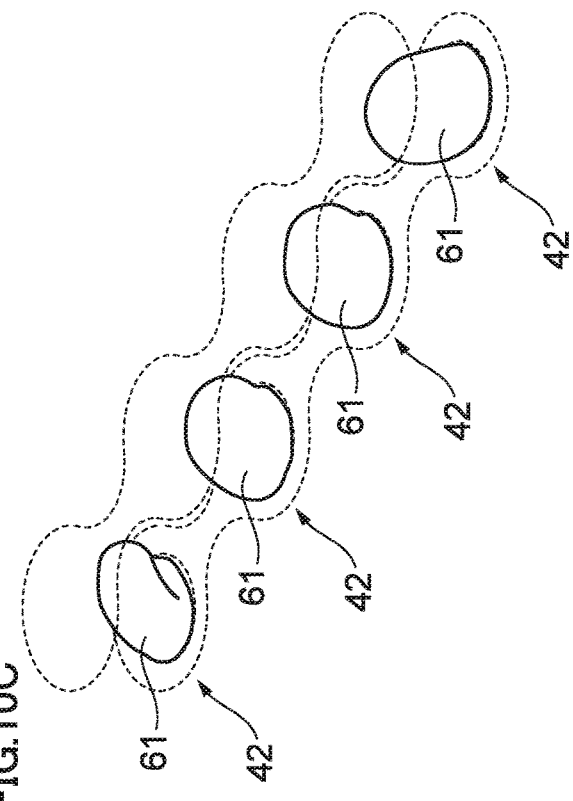
FIG. 10C depicts a perspective view illustrating a change in the shape of the molten solder after the IMS head moves away.

FIGS. 10B to 10D show perspective views illustrating a change in the shape of the molten solder 61 after the IMS head moves away. In FIG. 10B, each part of the molten solder 61 in corresponding one of the upper cavities 42 gathers to the center of the corresponding one of the upper cavities 42. In FIG. 10C, each part of the molten solder 61 in corresponding one of the upper cavities 42 gets independent from the other parts of the molten solder 61 in corresponding ones of the upper cavities 42. In FIG. 10D, each part of the molten solder 61 in corresponding one of the upper cavities 42 grows to a certain height and becomes corresponding one of the bumps 60, as shown, for example, FIG. 6D. In this simulation, the height of each of the bumps 60 is 3.8 micro meters.

Next, a fabrication procedure of a semiconductor device will be described.

Figure 11:
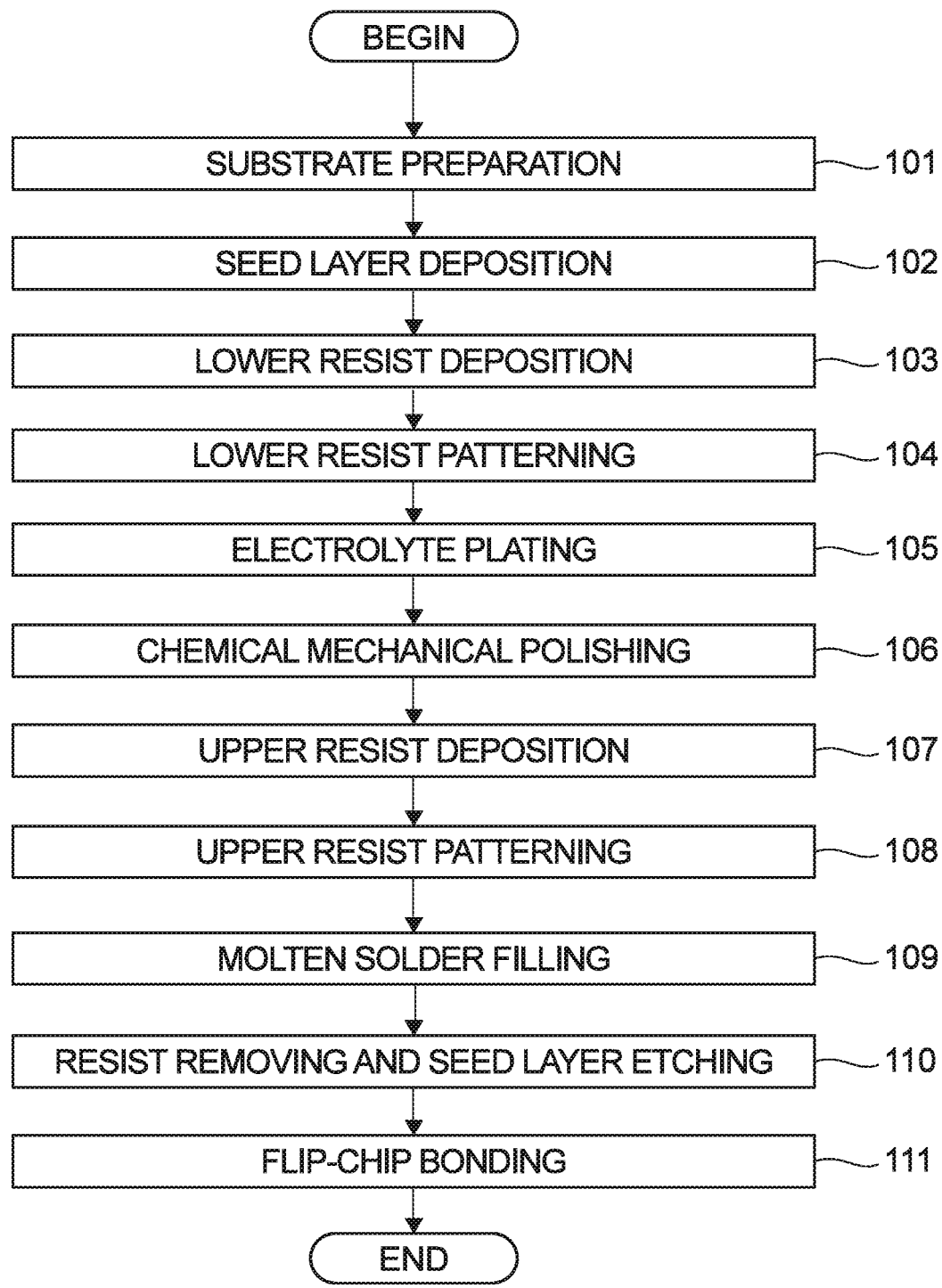
FIG. 11 depicts a flowchart representing an example of a first fabrication procedure of a semiconductor device.

Referring to FIG. 11, there is shown a flowchart representing an example of the first fabrication procedure of the semiconductor device. In the first fabrication procedure, the copper pillars 43 are assumed to be formed by electrolytic plating.

As shown in FIG. 11, the first fabrication procedure can include, in time order, a substrate preparation step 101, a seed layer deposition step 102, a lower resist deposition step 103, and a lower resist patterning step 104. The first fabrication procedure can further include, in time order, an electrolyte plating step 105, a chemical mechanical polishing step 106, an upper resist deposition step 107, and an upper resist patterning step 108. The first fabrication procedure can furthermore include, in time order, a molten solder filling step 109, a resist removing and seed layer etching step 110, and a flip-chip bonding step 111.

Referring to FIGS. 12A to 12I, there are shown cross-sectional views of a resist structure 150, a semiconductor chip 170, or a semiconductor device 190 while steps 101 to 111 of FIG. 11 are being executed.

Figure 12A:
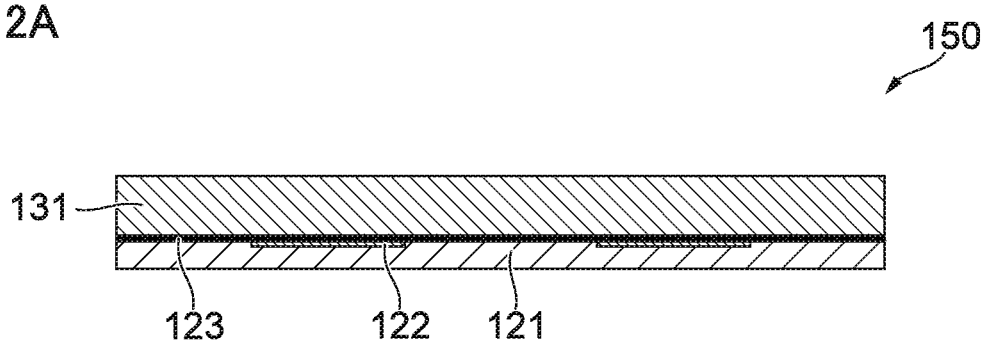
FIG. 12A depicts a cross-sectional view of a resist structure.

FIG. 12A shows a cross-sectional view of the resist structure 150 after steps 101 to 103 are completed. As shown in FIG. 12A, a seed layer 123 such as Ti/Cu layer can be deposited by sputtering on a substrate 121 having thereon metal pads 122 such as aluminum pads. The metal pads 122 serve as one example of the claimed conductive pads. And then, a lower resist 131 can be disposed by spin-coating on the seed layer 123.

Figure 12B:
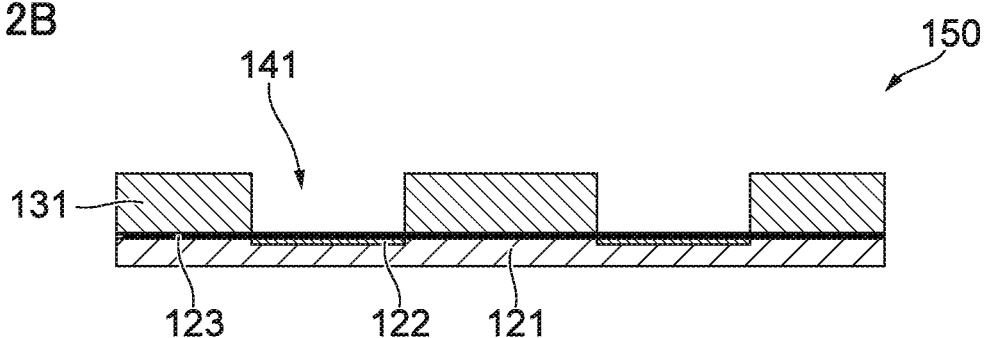
FIG. 12B depicts a cross-sectional view of a resist structure.

FIG. 12B shows a cross-sectional view of the resist structure 150 after step 104 is completed. As shown in FIG. 12B, the lower resist 131 can be patterned by exposure and development to form lower cavities 141 in the lower resist 131.

Figure 12C:
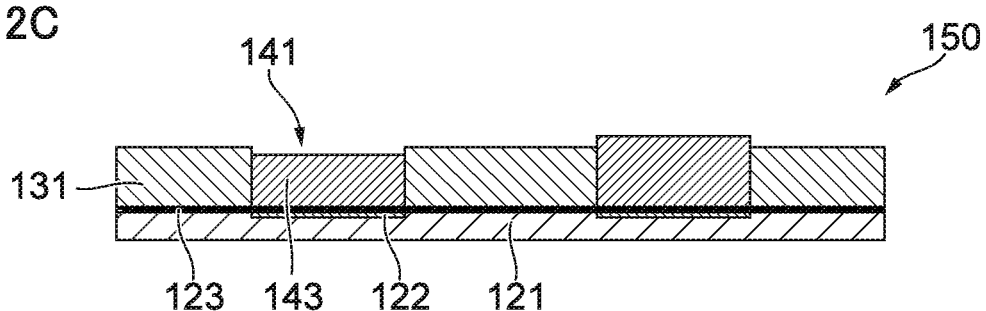
FIG. 12C depicts a cross-sectional view of a resist structure.

FIG. 12C shows a cross-sectional view of the resist structure 150 after step 105 is completed. As shown in FIG. 12C, copper can be electroplated on the seed layer 123 in the lower cavities 141 to form copper pillars 143 in the lower cavities 141. The copper pillars 143 serve as one example of the claimed conductive pillars.

Figure 12D:
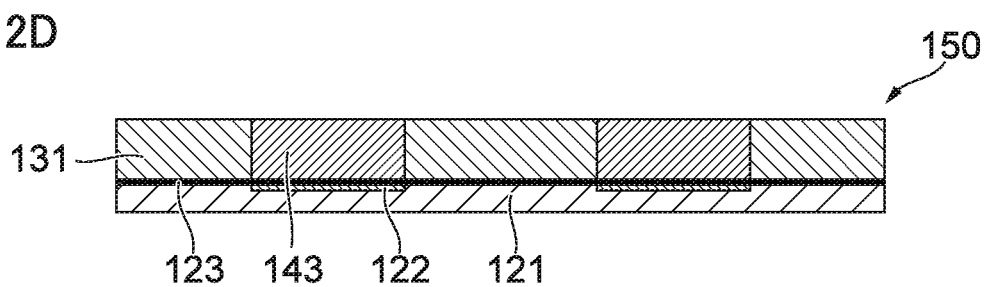
FIG. 12D depicts a cross-sectional view of a resist structure.

FIG. 12D shows a cross-sectional view of the resist structure 150 after step 106 is completed. As shown in FIG. 12D, a surface of a layer including the lower resist 131 and the copper pillars 143 can be planarized using chemical-mechanical polishing.

Figure 12E:
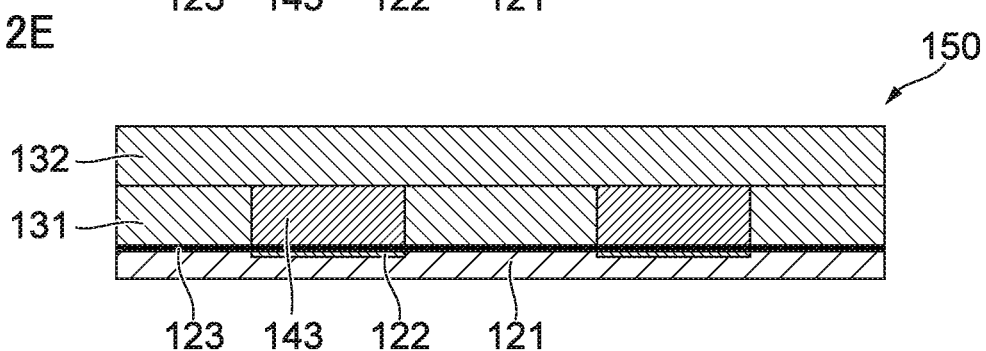
FIG. 12E depicts a cross-sectional view of a resist structure.

FIG. 12E shows a cross-sectional view of the resist structure 150 after step 107 is completed. As shown in FIG. 12E, an upper resist 132 can be deposited by spin-coating on the lower resist 131. In this case, the upper resist 132 can be partially deposited on the copper pillars 143.

Figure 12F:
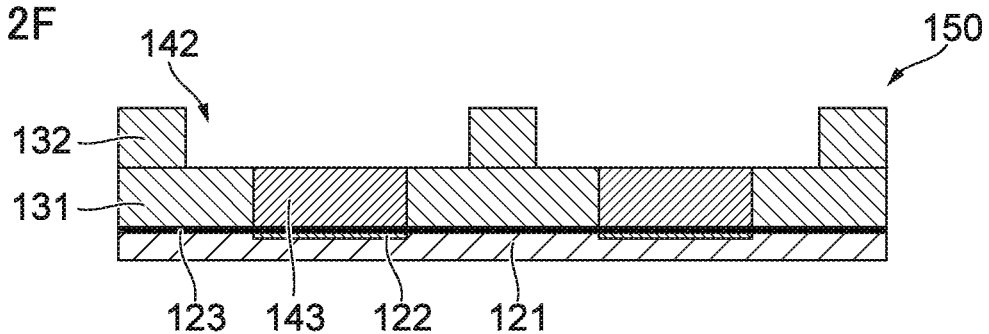
FIG. 12F depicts a cross-sectional view of a resist structure.

FIG. 12F shows a cross-sectional view of the resist structure 150 after step 108 is completed. As shown in FIG. 12F, the upper resist 132 can be patterned by exposure and development to form upper cavities 142 in the upper resist 132.

Note that the resist structure 150 normally indicates a structure not including the copper pillars 43, but here, a structure including the copper pillars 43 is also referred to as the resist structure 150 for convenience.

Figure 12G:
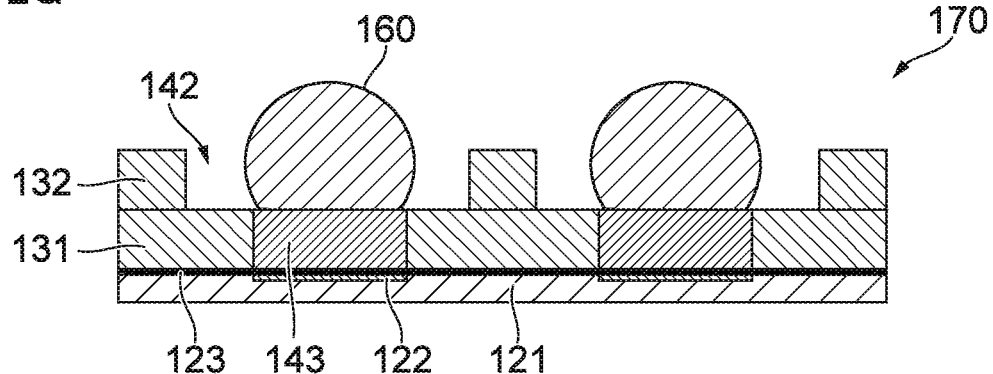
FIG. 12G depicts a cross-sectional view of a semiconductor chip.

FIG. 12G shows a cross-sectional view of the semiconductor chip 170 after step 109 is completed. As shown in FIG. 12G, the bumps 160 can be formed on the copper pillars 143 by filling the molten solder in the upper cavities 142 using IMS technique. The molten solder serves as one example of the claimed conductive material.

Figure 12H:
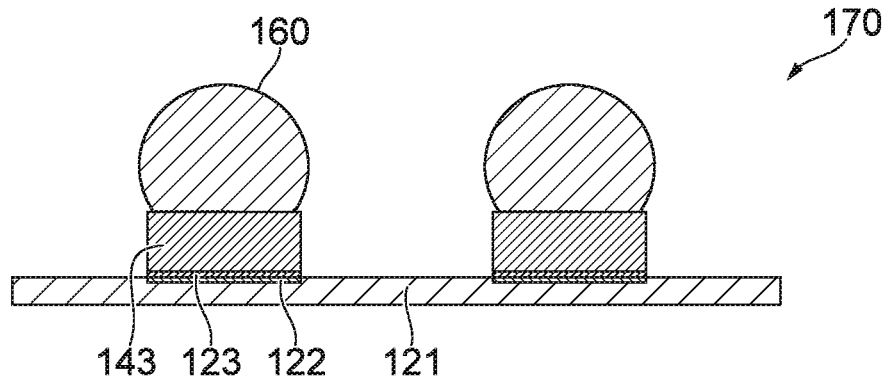
FIG. 12H depicts a cross-sectional view of a semiconductor chip.

FIG. 12H shows a cross-sectional view of the semiconductor chip 170 after step 110 is completed. As shown in FIG. 12H, the lower resist 131 and the upper resist 132 (shown in FIG. 12G) can be removed. And then, the seed layer 123 can be etched except for parts on which the copper pillars 143 are deposited.

Figure 12I:
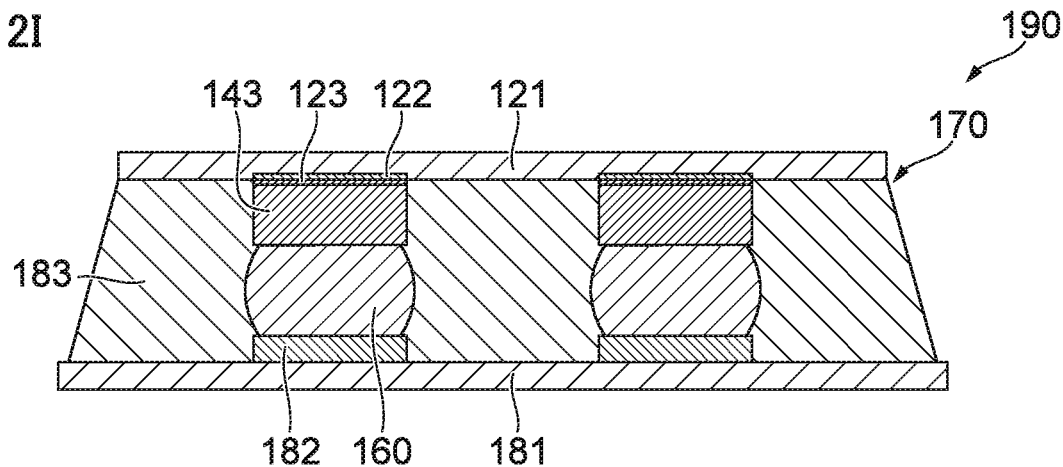
FIG. 12I depicts a cross-sectional view of the semiconductor device.

FIG. 12I shows a cross-sectional view of the semiconductor device 190 after step 111 is completed. As shown in FIG. 12I, the semiconductor chip 170 can be turned upside down and connected to a circuit board 181 by flip-chip bonding. Specifically, the bumps 160 can be connected to the electrodes 182 provided on the circuit board 181, and underfill 183 can be filled between the semiconductor chip 170 and the circuit board 181.

Note that although the flowchart of FIG. 11 is assumed to include step 106, the flowchart may not include step 106. In this case, the cross-sectional views of FIGS. 12E to 12I are expected to show that the left pillar and the right pillar of the copper pillars 43 remain different in height.

Further, step 107 is assumed to be performed after step 105 in the flowchart of FIG. 11, and the cross-sectional views of FIGS. 12C and 12E are assumed to be in accordance with this processing order, but the processing order is not limited to this. Step 105 can be performed after step 107 in the flowchart of FIG. 11, and the cross-sectional views of FIGS. 12C and 12E can be in accordance with this modified processing order. Also in this case, the flowchart of FIG. 11 may not include step 106.

Figure 13:
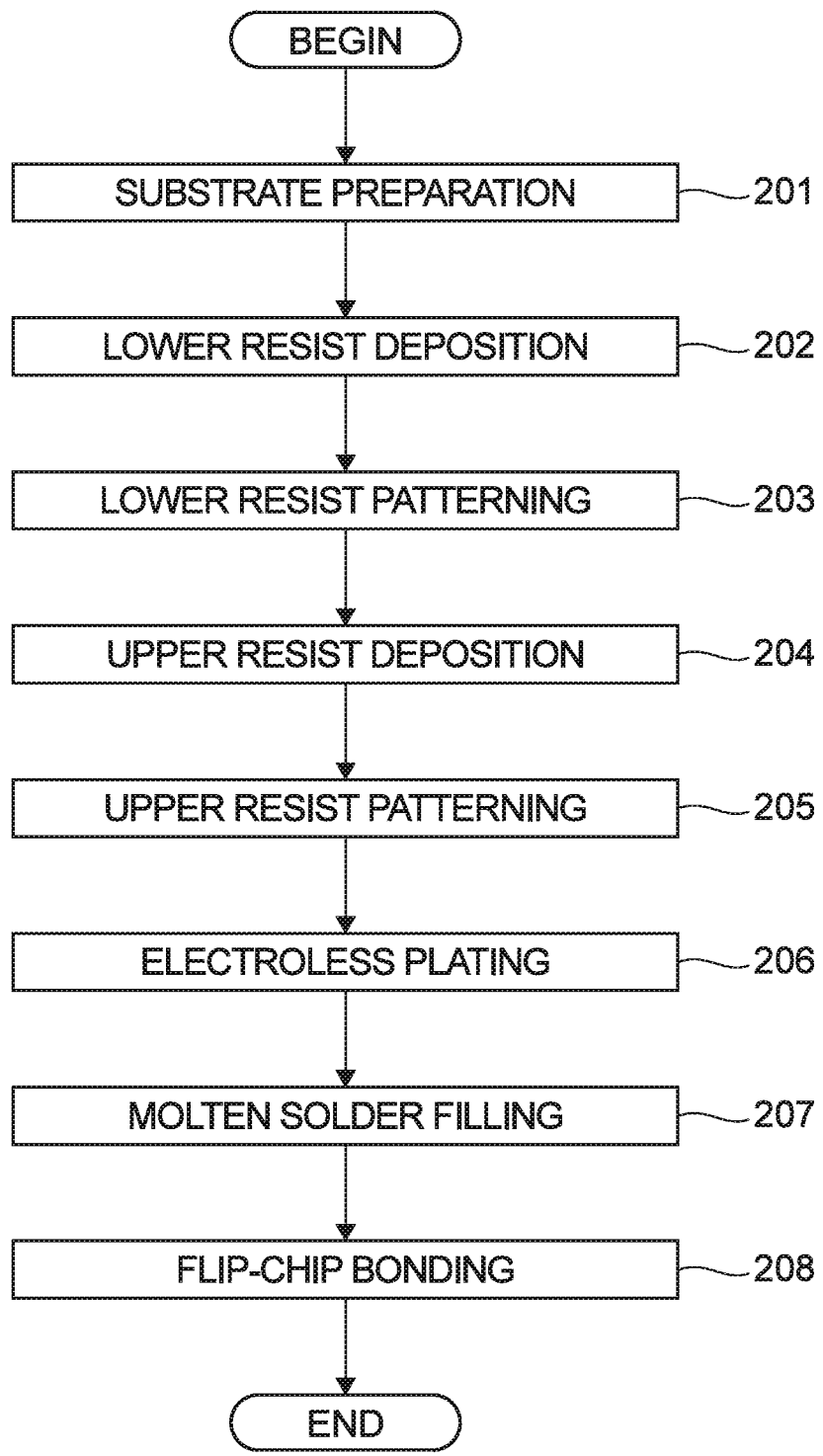
FIG. 13 depicts a flowchart representing an example of a second fabrication procedure of the semiconductor device.

Referring to FIG. 13, there is shown a flowchart representing an example of the second fabrication procedure of the semiconductor device. In the second fabrication procedure, the copper pillars 43 are assumed to be formed by electroless plating.

As shown in FIG. 13, the second fabrication procedure can include, in time order, a substrate preparation step 201, a lower resist deposition step 202, and a lower resist patterning step 203. The second fabrication procedure can further include, in time order, an upper resist deposition step 204, an upper resist patterning step 205, and an electroless plating step 206. The second fabrication procedure can furthermore include, in time order, a molten solder filling step 207, and a flip-chip bonding step 208.

Referring to FIGS. 14A to 14G, there are shown cross-sectional views of a resist structure 250, a semiconductor chip 270, or a semiconductor device 290 while steps 201 to 208 of FIG. 13 are being executed.

Figure 14A:
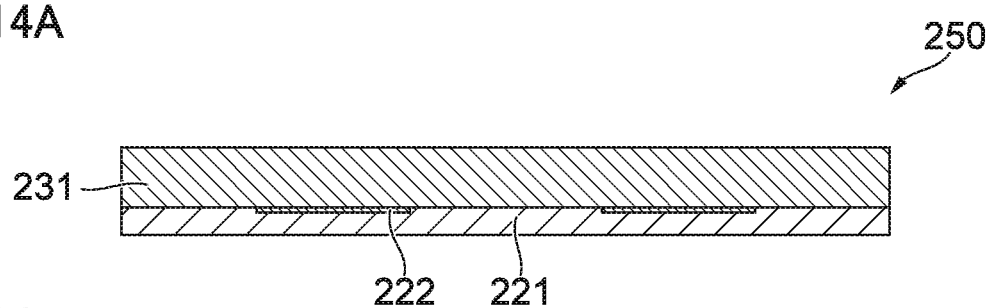
FIG. 14A depicts a cross-sectional view of a resist structure.

FIG. 14A shows a cross-sectional view of the resist structure 250 after steps 201 and 202 are completed. As shown in FIG. 14A, a lower resist 231 can be disposed by spin-coating on a substrate 221 having thereon metal pads 222 such as aluminum pads. The metal pads 222 serve as one example of the claimed conductive pads.

Figure 14B:
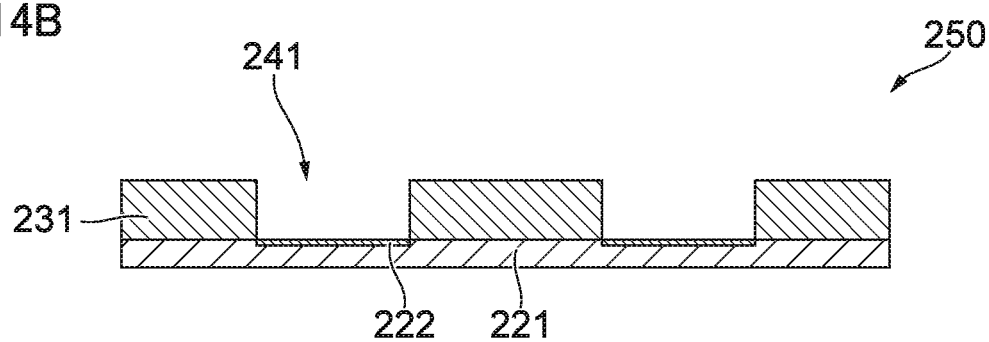
FIG. 14B depicts a cross-sectional view of a resist structure.

FIG. 14B shows a cross-sectional view of the resist structure 250 after step 203 is completed. As shown in FIG. 14B, the lower resist 231 can be patterned by exposure and development to form lower cavities 241 in the lower resist 231.

Figure 14C:
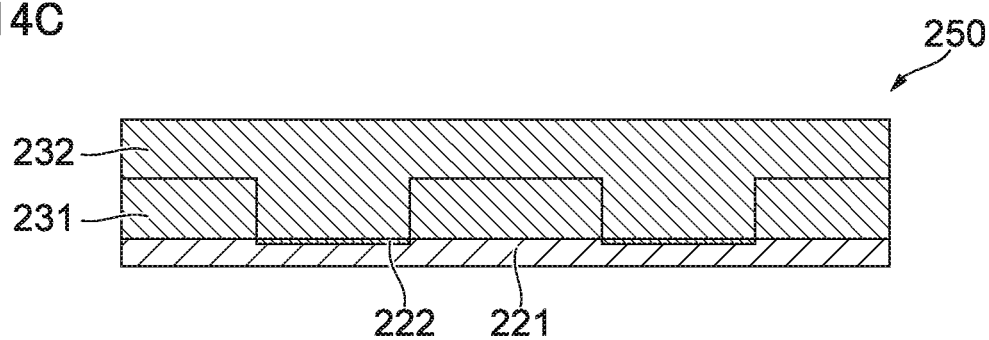
FIG. 14C depicts a cross-sectional view of a resist structure.

FIG. 14C shows a cross-sectional view of the resist structure 250 after step 204 is completed. As shown in FIG. 14C, an upper resist 232 can be deposited by spin-coating on the lower resist 231. In this case, the upper resist 232 can partially enter the lower cavities 241.

Figure 14D:
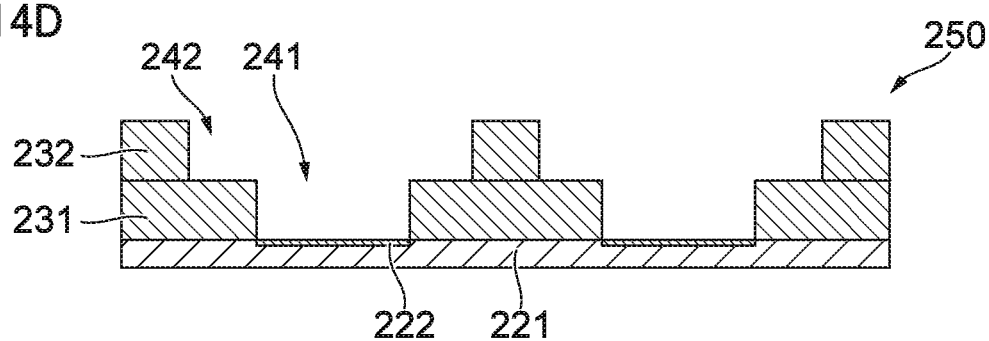
FIG. 14D depicts a cross-sectional view of a resist structure.

FIG. 14D shows a cross-sectional view of the resist structure 250 after step 205 is completed. As shown in FIG. 14D, the upper resist 232 can be patterned by exposure and development to form upper cavities 242 in the upper resist 232. In this case, the lower cavities 241 can be formed as well in the lower resist 231.

Figure 14E:
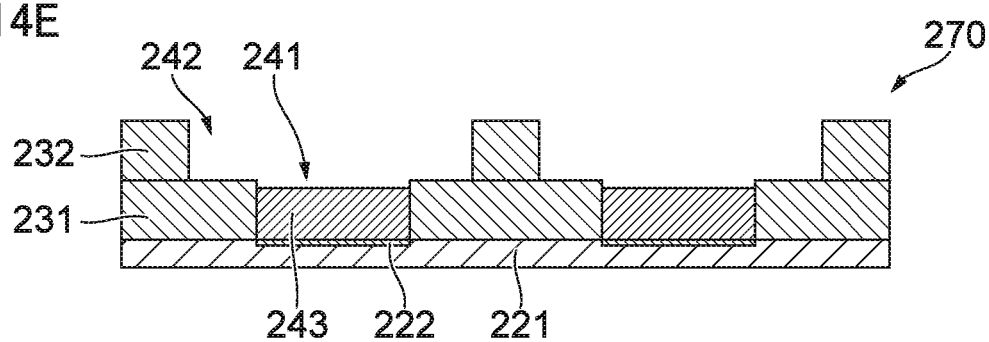
FIG. 14E depicts a cross-sectional view of a resist structure.

FIG. 14E shows a cross-sectional view of the semiconductor chip 270 after step 206 is completed. As shown in FIG. 14E, copper can be electroless-plated on the metal pads 222 to form copper pillars 243 in the lower cavities 241. The copper pillars 243 serve as one example of the claimed conductive pillars.

Figure 14F:
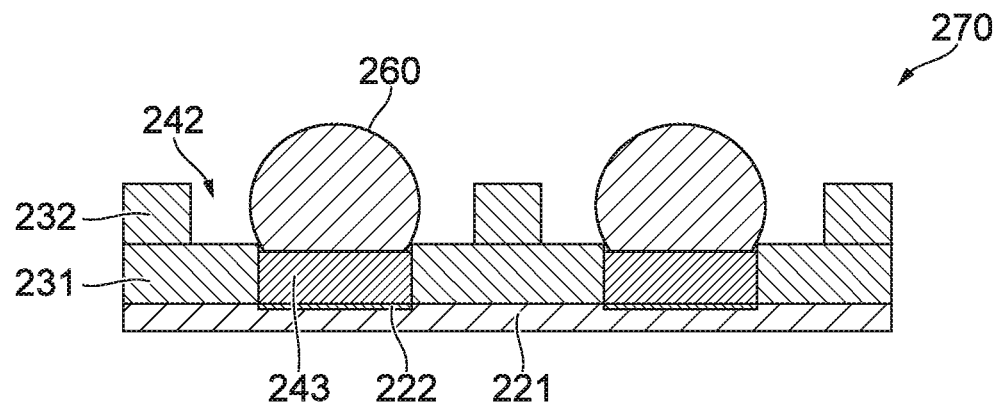
FIG. 14F depicts a cross-sectional view of a semiconductor chip.

FIG. 14F shows a cross-sectional view of the semiconductor chip 270 after step 207 is completed. As shown in FIG. 14F, the bumps 260 can be formed on the copper pillars 243 by filling the molten solder in the upper cavities 242 using IMS technique. The molten solder serves as one example of the claimed conductive material.

Figure 14G:
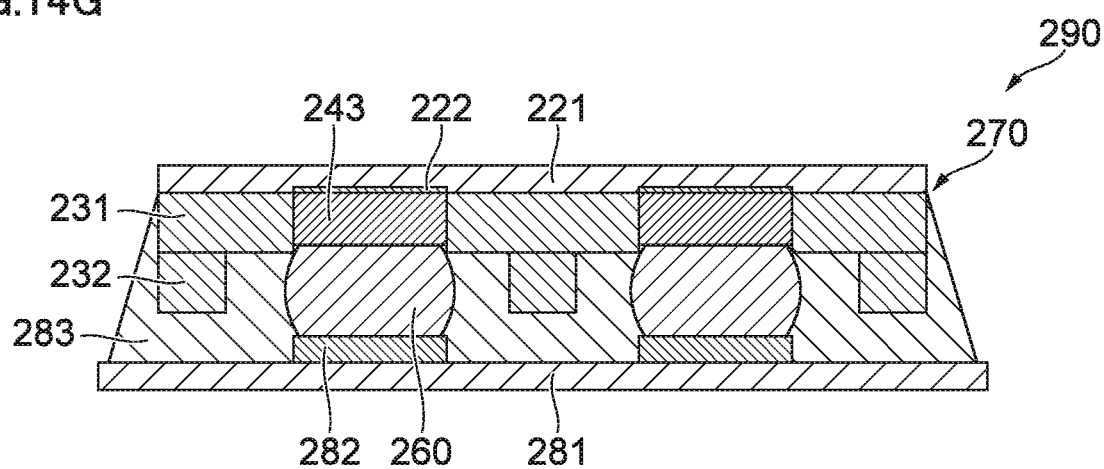
FIG. 14G depicts a cross-sectional view of a semiconductor device.

FIG. 14G shows a cross-sectional view of the semiconductor device 290 after step 208 is completed. As shown in FIG. 14G, the semiconductor chip 270 can be turned upside down and connected to a circuit board 281 by flip-chip bonding. Specifically, the bumps 260 can be connected to the electrodes 282 provided on the circuit board 281, and underfill 283 can be filled between the semiconductor chip 270 and the circuit board 281.

Note that in the second fabrication procedure, since no seed layer is deposited and no seed layer etching is required, the semiconductor chip 270 can be connected to the circuit board 281 by flip-chip bonding while keeping the lower resist 231 and the upper resist 232 unremoved. In this case, the lower resist 231 comes above the upper resist 232. Therefore, strictly speaking, the lower resist 231 in FIGS. 14A to 14F needs to be referred to as an upper resist in FIG. 14G, and the upper resist 232 in FIGS. 14A to 14F needs to be referred to as a lower resist in FIG. 14G. However, the lower resist 231 in FIGS. 14A to 14F is referred to as the lower resist 231 also in FIG. 14G, and the upper resist 232 in FIGS. 14A to 14F is referred to as the upper resist 232 also in FIG. 14G, for convenience to avoid confusion.

Alternatively, also in the second fabrication procedure, the semiconductor chip 270 can be connected to the circuit board 281 by flip-chip bonding after the lower resist 231 and the upper resist 232 are removed, similarly to the first fabrication procedure.

Note that in the first exemplary embodiment, each of the cross-sectional views shows two lower cavities and two upper cavities at most, and accordingly shows two metal pads, two copper pillars, and two bumps at most, but the number of the constituent elements is not limited to this. The semiconductor device according to the first exemplary embodiment can include more than two lower cavities and more than two upper cavities, and can accordingly include more than two metal pads, more than two copper pillars and more than two bumps.

Next, an explanation will be given of the second exemplary embodiment in which the present invention is applied to a case where bumps are formed by plating.

The second exemplary embodiment can also employ a two-layer resist structure in which a lower cavity and a upper cavity are formed in a lower resist and an upper resist, respectively, so that the diameter of the upper cavity is larger than the diameter of the lower cavity. Such a two-layer resist structure can reduce a problem with a single-layer resist structure in that plating solution is difficult to enter a cavity formed in such a single resist.

In the second exemplary embodiment, since an IMS head scanning is not performed to form the bumps, a part of a resist between the upper cavities can be thin. Therefore, it is not necessary to employ a configuration for connecting the upper cavities as shown in FIGS. 8, 9A, 9B, and 10A to 10D. Rather, it is better that the upper cavities are not connected so that adjacent bumps are not short-circuited.

Note that in the second exemplary embodiment too, not only electrolytic plating but also electroless plating can be used as the plating.

Next, an explanation will be given of the third exemplary embodiment in which the present invention is applied to an electronic apparatus mounted with the semiconductor device according to the first exemplary embodiment or the second exemplary embodiment. The electronic apparatus can be, for example, a personal computer, a mobile phone, or the like.

Figure 15:
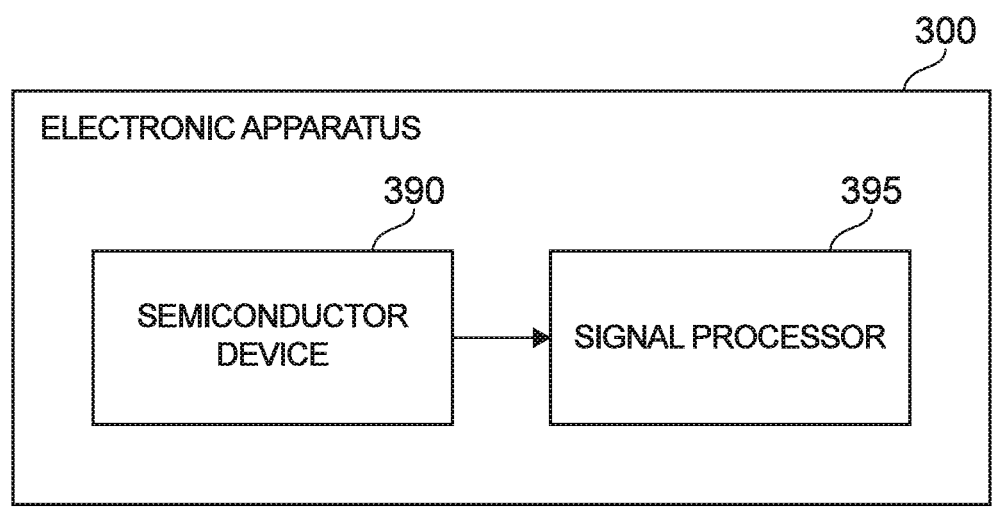
FIG. 15 depicts a block diagram of an electronic apparatus according to a third exemplary embodiment.

Referring to FIG. 15, there is shown a block diagram of an electronic apparatus 300 according to the third exemplary embodiment. As shown in FIG. 15, the electronic apparatus 300 can include a semiconductor device 390 and a signal processor 395. The semiconductor device 390 corresponds to the semiconductor device 190 in the first exemplary embodiment or the semiconductor device 290 in the second exemplary embodiment. The signal processor 395 can process a signal outputted from the semiconductor device 390.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a resist structure, the method comprising:
   forming two or more conductive pads on a substrate;
   forming a lower resist on the substrate and two or more conductive pads;
   patterning the lower resist to form a lower cavity overlapping each of the two or more conductive pads, wherein each of the two or more lower cavities has a first diameter;
   forming an upper resist on the lower resist; and
   patterning the upper resist to form an upper cavity overlapping the two or more lower cavities, wherein the upper cavity has cavity regions having a second diameter larger than the first diameter above each of the two or more lower cavities, and connecting regions between adjacent cavity regions.

2. The method of claim 1, wherein at least three cavity regions are connected by connecting regions.

3. A method for fabricating a semiconductor device, the method comprising:
   forming a plurality of conductive pads on a substrate;
   patterning a lower resist to form a plurality of lower cavities, wherein each of the plurality of lower cavities is located above a corresponding one of the plurality of conductive pads;
   patterning an upper resist to form an upper cavity overlapping the plurality of lower cavities, wherein the upper cavity has a plurality of cavity regions, wherein each of the cavity regions is located above a corresponding one of the plurality of lower cavities, and each cavity region has a diameter larger than a diameter of the corresponding one of the plurality of lower cavities, and a connecting region between adjacent cavity regions;
   forming a conductive pillar in each of the plurality of lower cavities;
   filling conductive material in the plurality of cavity regions and connecting regions to form a plurality of bumps, each of the plurality of bumps being located on a corresponding one of the plurality of conductive pillars; and
   connecting the plurality of bumps to a circuit board by flip-chip bonding.

4. The method of claim 3, further comprising depositing the upper resist on the lower resist after forming the plurality of conductive pillars.

5. The method of claim 4, further comprising planarizing a surface of a layer including the lower resist and the plurality of conductive pillars after forming the plurality of conductive pillars and before depositing the upper resist on the lower resist.

6. The method of claim 3, further comprising depositing the upper resist on the lower resist before forming the plurality of conductive pillars.

7. The method of claim 3, wherein the plurality of conductive pillars are formed by electrolytic plating.

8. The method of claim 7, further comprising:
depositing a seed layer on the substrate; and
depositing the lower resist on the seed layer, wherein
the plurality of bumps are connected to the circuit board after the upper resist and the lower resist are removed and parts of the seed layer are etched.

9. The method of claim 3, wherein the plurality of conductive pillars are formed by electroless plating.

10. The method of claim 9, further comprising depositing the lower resist on the substrate, wherein
the plurality of bumps are connected to the circuit board along with the upper resist and the lower resist.

11. The method of claim 3, wherein the conductive material is molten solder injected using Injection Molded Solder (IMS) technology.

12. The method of claim 11, wherein at least three cavity regions are connected by connecting regions.

13. The method of claim 12, wherein the molten solder is filled in the at least three cavity regions by an injection head scanning in a direction, the injection head being a head for injecting the molten solder, the direction being perpendicular to a direction in which the at least three cavity regions are aligned.

14. The method of claim 3, wherein the conductive material is plated solder.

15. A resist structure comprising:
a plurality of conductive pads on a substrate;
a lower resist having a plurality of lower cavities, the lower resist being on the substrate, and each of the plurality of lower cavities being located above a corresponding one of the plurality of conductive pads; and
an upper resist on the lower resist, wherein the upper resist has an upper cavity with a plurality of cavity regions, each of the plurality of cavity regions overlapping an associated lower cavity, and connecting regions between adjacent cavity regions, wherein the cavity regions have a diameter larger than a diameter of each of the plurality of lower cavities.

16. The resist structure of claim 15, wherein at least three cavity regions are connected by connecting regions.

17. A semiconductor device comprising:
a plurality of conductive pads on a substrate;
a lower resist having a plurality of lower cavities, wherein each of the plurality of lower cavities overlaps a corresponding one of the plurality of conductive pads;
an upper resist on the lower resist, wherein the upper resist has an upper cavity with a plurality of cavity regions, each of the plurality of cavity regions overlapping an associated lower cavity, and connecting regions between adjacent cavity regions, wherein the cavity regions have a diameter larger than a diameter of the corresponding one of the plurality of lower cavities;
a plurality of conductive pillars, each of the plurality of conductive pillars being located in the corresponding one of the plurality of lower cavities;
a plurality of bumps of conductive material in the plurality of cavity regions and connecting regions, each of the plurality of bumps being located on a corresponding one of the plurality of conductive pillars; and
a circuit board to which the plurality of bumps are connected by flip-chip bonding.

18. The semiconductor device of claim 17, wherein the conductive material is molten solder injected using Injection Molded Solder (IMS) technology.

19. The semiconductor device of claim 18, wherein at least four cavity regions are connected by connecting regions.

20. The semiconductor device of claim 17, wherein the conductive material is plated solder.

21. An electronic apparatus comprising:
a semiconductor device; and
a signal processor configured to process a signal outputted from the semiconductor device, wherein
the semiconductor device comprises:
a plurality of conductive pads on a substrate;
a lower resist having a plurality of lower cavities, wherein each of the plurality of lower cavities overlaps a corresponding one of the plurality of conductive pads;
an upper resist on the lower resist, wherein the upper resist has an upper cavity with a plurality of cavity regions, each of the plurality of cavity regions overlapping an associated lower cavity, and connecting regions between adjacent cavity regions, wherein the cavity regions have a diameter larger than a diameter of the corresponding one of the plurality of lower cavities;
a plurality of conductive pillars, each of the plurality of conductive pillars being located in the corresponding one of the plurality of lower cavities;
a plurality of bumps of conductive material in the plurality of cavity regions and connecting regions, each of the plurality of bumps being located on a corresponding one of the plurality of conductive pillars; and
a circuit board to which the plurality of bumps are connected by flip-chip bonding.

22. The electronic apparatus of claim 21, wherein the conductive material is molten solder injected using Injection Molded Solder (IMS) technology.

23. The electronic apparatus of claim 22, wherein at least three cavity regions are connected by connecting regions.

24. The electronic apparatus of claim 21, wherein the conductive material is plated solder.

* * * * *